(12) United States Patent
Friedman et al.

(10) Patent No.: US 10,236,365 B2
(45) Date of Patent: *Mar. 19, 2019

(54) HOMOEPITAXIAL TUNNEL BARRIERS WITH HYDROGENATED GRAPHENE-ON-GRAPHENE FOR ROOM TEMPERATURE ELECTRONIC DEVICE APPLICATIONS

(71) Applicant: The United States of America, as represented by the Secretary of the Navy, Washington, DC (US)

(72) Inventors: Adam L. Friedman, Silver Spring, MD (US); Olaf M. J. van 't Erve, Falls Church, VA (US); Jeremy T. Robinson, Washington, DC (US); Berend T. Jonker, Waldorf, MD (US); Keith E. Whitener, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/883,935

(22) Filed: Jan. 30, 2018

(65) Prior Publication Data
US 2018/0182852 A1    Jun. 28, 2018

Related U.S. Application Data

(63) Continuation of application No. 15/426,119, filed on Feb. 7, 2017, now Pat. No. 10,128,357.
(Continued)

(51) Int. Cl.
*H01L 29/66* (2006.01)
*H01L 21/02* (2006.01)
*H01L 21/04* (2006.01)
*H01L 29/16* (2006.01)
*H01L 29/88* (2006.01)
(Continued)

(52) U.S. Cl.
CPC .... *H01L 29/66984* (2013.01); *H01L 21/0259* (2013.01); *H01L 21/0262* (2013.01); *H01L 21/02104* (2013.01); *H01L 21/02527* (2013.01); *H01L 21/02634* (2013.01); *H01L 21/041* (2013.01); *H01L 21/042* (2013.01); *H01L 21/0435* (2013.01); *H01L 29/1606* (2013.01); *H01L 29/66015* (2013.01); *H01L 29/88* (2013.01); *H01L 43/02* (2013.01);
(Continued)

(58) Field of Classification Search
CPC ......... H01L 29/66984; H01L 29/66015; H01L 29/1606; H01L 29/88; H01L 21/02527; H01L 21/0259; H01L 21/0262; H01L 21/02634; H01L 21/041; H01L 21/042; H01L 21/0435; H01L 43/02; H01L 43/10; H01L 43/12
See application file for complete search history.

(56) References Cited

U.S. PATENT DOCUMENTS

| 9,318,591 B2 * | 4/2016 | Geim | H01L 29/775 |
| 2016/0043235 A1 * | 2/2016 | Lin | H01L 29/78684 |
| | | | 257/29 |

* cited by examiner

*Primary Examiner* — Cheung Lee
*Assistant Examiner* — Stephen C Smith
(74) *Attorney, Agent, or Firm* — US Naval Research Laboratory; Stephen T. Hunnius

(57) ABSTRACT

A homoepitaxial, ultrathin tunnel barrier-based electronic device in which the tunnel barrier and transport channel are made of the same material—graphene.

5 Claims, 6 Drawing Sheets

Related U.S. Application Data

(60) Provisional application No. 62/296,926, filed on Feb. 18, 2016.

(51) Int. Cl.
*H01L 43/12* (2006.01)
*H01L 43/02* (2006.01)
*H01L 43/10* (2006.01)
H01L 29/08 (2006.01)

(52) U.S. Cl.
CPC .............. *H01L 43/10* (2013.01); *H01L 43/12* (2013.01); *H01L 29/0895* (2013.01)

HOMOEPITAXIAL TUNNEL BARRIERS WITH HYDROGENATED GRAPHENE-ON-GRAPHENE FOR ROOM TEMPERATURE ELECTRONIC DEVICE APPLICATIONS

This application claims priority to and the benefits of U.S. Patent Application No. 62/296,926 filed on Feb. 18, 2016, and U.S. patent application Ser. No. 15/426,119 filed on Feb. 7, 2017, the entirety of each is herein incorporated by reference.

BACKGROUND

In spite of nearly a decade of research on spin transport in graphene, there has been little improvement in important metrics such as the spin lifetime and spin diffusion length, and reported values remain far below those predicted by theory based on graphene's low atomic number and spin-orbit coupling. Understanding the extrinsic limiting factors and achieving the theoretically predicted values of these metrics is key for enabling the type of advanced, low-power, high performance spintronic devices envisioned beyond Moore's law. Scattering caused by tunnel barriers, which are essential for solving the conductivity mismatch problem for electrical spin injection from a ferromagnetic metal into a semiconductor, presents a major impediment to integration of graphene spintronic devices into modern electronic platforms. Uniform, pinhole/defect free tunnel barriers on graphene are not easily attained with the conventional methods that use oxides.

Recent studies using pinhole-free, high resistance tunnel barriers (e.g., monolayer BN and amorphous carbon) that minimally affect the graphene surface showed enhanced metrics for spin transport in graphene over previous work using conventional oxide tunnel barriers. Graphene itself exhibits many of the characteristics expected from a perfect tunnel barrier, including discrete monolayer thickness, imperviousness to interdiffusion, high uniformity, and high out-of-plane resistance, offering a new paradigm for tunnel barriers in magnetic tunnel junctions and spin injection into silicon. Moreover, in a graphene bilayer, by electrically decoupling the top layer from the bottom using chemical functionalization, a fluorographene/graphene homoepitaxial tunnel barrier structure showed the highest spin polarization achieved in graphene. Such functionalized homoepitaxial structures provide an elegant approach for realization of graphene-based spintronic devices, although spin-dependent operation was not achieved at room temperature, and fluorinated graphene has reduced stability compared to conventional dielectric materials.

BRIEF SUMMARY OF THE INVENTION

This invention disclosure describes a process to fabricate a homoepitaxial, ultrathin tunnel barrier-based electronic device in which the tunnel barrier and transport channel are made of the same material, graphene. A homoepitaxial tunnel barrier/transport structure is created using a stack of individual monolayers of graphene, in one embodiment 4 monolayers, with the upper layers then hydrogenated, so that they act as a tunnel barrier on the lower pristine graphene electronic transport channel.

Demonstrated herein is that this new type of device displays enhanced spintronic properties over heteroepitaxial devices, and displays room temperature operation of a spin valve, entirely enabled by our new hydrogenated graphene tunnel barrier fabrication process.

DETAILED DESCRIPTION

Figure 1:
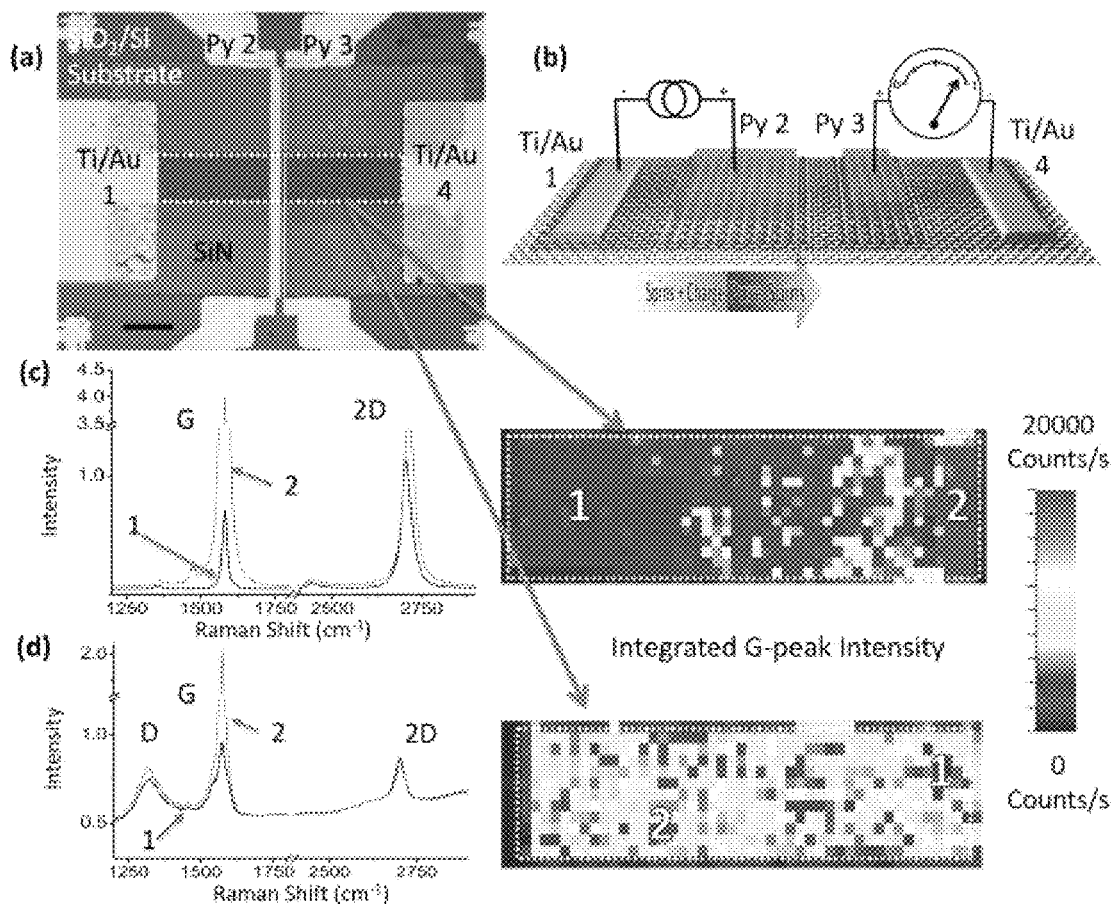
FIG. 1 illustrates: (a) An optical microscope image of a four-terminal graphene device. The white dotted line outlines the 4-layer graphene channel (scale bar=15 μm). (b) A cartoon schematic of a device configured in a non-local spin valve geometry. (c) Raman spectra and integrated G peak intensity map of a 4-layer graphene device channel as shown in (a). The spectra are taken from points 1 and 2, respectively, from the Raman map and identify a "large" and "resonant" twist angle ($\lambda$=488 nm). (d) Raman spectra and integrated G peak intensity map of a different 4-layer graphene device after hydrogenation. The spectra are taken from points 1 and 2, respectively, from the Raman map and also identify a "large" and "resonant" twist angle domain. The appearance of a D defect peak and continued observation of resonance indicates that the top graphene layers have been hydrogenated and that lower graphene layer has not been hydrogenated.

This invention disclosure describes a process to fabricate a homoepitaxial, ultrathin tunnel barrier-based electronic device in which the tunnel barrier and transport channel are made of the same material, graphene. A homoepitaxial tunnel barrier/transport structure is created using a stack individual monolayers of graphene, with the upper layers then hydrogenated, so that they act as a tunnel barrier on the lower pristine graphene electronic transport channel. In one example, four monolayers are used. And, demonstrates that the new type of device displays enhanced spintronic properties over heteroepitaxial devices, and displays room temperature operation of a spin valve, entirely enabled by our new hydrogenated graphene tunnel barrier fabrication process.

Hydrogenation of graphene offers an alternative method to achieve a homoepitaxial tunnel barrier on graphene. In contrast with fluorination and plasma treatments, the Birch reduction hydrogenation process we employ provides a rapid, gentler, and more stable functionalization with much higher hydrogen coverage. Recent experimental and theoretical studies show that hydrogenated graphene could be magnetic, which could be used to control spin relaxation in the graphene.

Here we show that hydrogenated graphene serves as an effective spin tunnel barrier for graphene up to room temperature. Beginning with a multilayer stack of graphene, we hydrogenate the top layers to create a tunnel barrier, and demonstrate electrical spin injection, transport, precessional dephasing, and detection in the lower graphene channel layers using the 4-terminal non-local spin valve (NLSV) geometry. We extract spin lifetimes from the Hanle effect measurements, and polarization efficiencies from the NLSV measurements. We demonstrate higher polarization efficiencies than most competing tunnel barrier technologies that use oxides. Additionally our homoepitaxial hydrogenated graphene tunnel barrier/graphene transport channel devices are thinner, less expensive to produce, and inherently flexible.

Example 1

Formation of the Homoepitaxial Graphene Tunnel Barrier/Transport Channel Device

Graphene was grown by chemical vapor deposition (CVD) via decomposition of methane in small Cu foil enclosures. This method produces monolayer graphene films with grain sizes on the order of hundreds of microns containing minimal defects. After growth, the Cu foil is removed by etching and four graphene layers are transferred and stacked using a technique known to produce high quality, clean multilayer stacks. We found that four stacked layers can be a minimum to ensure that after hydrogenation, there is still a conductive channel in the stack. Deep-UV lithography is used with PMMA followed by oxygen plasma to define square graphene mesas. PMMA was found to leave less residual dirt on the surface of the films than standard photolithography resists. The sample is rinsed in acetone and isopropyl alcohol (IPA) to remove the etch mask. Reference contacts and bond pads are then defined using a MMA/PMMA mask with features defined using Deep-UV lithography. Ti/Au is deposited using electron beam deposition and lift-off in acetone. One more MMA/PMMA mask with deep-UV lithography, followed by sputter deposition of 10 nm of SiN is used to encapsulate the edges of the 4-layer graphene, attempting to prevent hydrogen from getting underneath the graphene.

The sample is then hydrogenated using the Birch reduction process. Briefly, graphene samples were added to 10 mL of liquid ammonia at −78° C. Lithium wire (50 mg) was added in small pieces to the reaction and the vessel was swirled to homogenize the resultant blue color. After 2 minutes, the reaction was quenched by adding an excess of ethanol slowly while continuously swirling to prevent the reaction from bubbling over. The wafer was removed from the vessel, rinsed with more ethanol, and dried under $N_2$. We attempted to perform this hydrogenation with 2 and 3 layers stacks. A bilayer of graphene is completely hydrogenated, thus electrically insulating and usually unusable for this experiment. A trilayer of graphene has the first two layers completely hydrogenated and the third layer mostly hydrogenated, again yielding an insulating channel, usually unusable for this experiment. Four layers is the thinnest stack that still presents a complete conducting path of un-hydrogenated graphene underneath the upper hydrogenated layers. Hydrogen may intercalate between layers through edges, defects, and grain boundaries in the graphene. Concurrently hydrogenated single layer and bilayer devices shows a resistance of ~45 GΩ after hydrogenation, indicating that at least the top two layers of graphene are completely insulating after hydrogenation.

FIG. 1(*a*) shows an optical image of a completed device and FIG. 1(*b*) shows a cartoon schematic of a completed device in a NLSV measurement configuration, used later in the reduction to practice. FIG. 1(*c*) shows Raman spectra of an as-fabricated 4-layer graphene structure with the characteristic D (1350 $cm^{-1}$), G (~1600 $cm^{-1}$), and 2D (~2700 $cm^{-1}$) peaks. The D peak intensity, which is associated with defects, is minimal in as-fabricated structures and indicates that high-quality graphene multilayer devices can be realized even after several sequential transfers. The crystalline orientation between each graphene layer, or twist angle (θ), determines the relative degree of electronic coupling between layers. When clean interfaces are present in stacked graphene films, electronic coupling can be measured via Raman, where the G and 2D peak intensities vary by known quantities with twist angle. The black curve in the spectrum in FIG. 1(*c*) highlights a "large" twist angle (θ>16°) domain, which was taken from spot 1 of the accompanying Raman micrograph, where the code corresponds to the integrated G-peak intensity. The first curve in the spectrum, taken from spot 2, highlights a resonant twist angle, caused by electronic coupling between the graphene layers. After hydrogenation by the Birch reduction process (see Methods), we see the emergence of the D peak and the base of the G peak broadens (FIG. 1(*d*)), indicating that hydrogen functionalization has occurred. Based on the continued presence of a sharp G and 2D peak after hydrogenation, we interpret the resulting spectra as a linear combination of hydrogenated to graphene layers and pristine bottom graphene layers. In addition, the corresponding integrated G-peak intensity micrograph shows an accompanying change in interlayer electronic interaction caused by the hydrogenation. We still observe electronic coupling, demonstrated by the resonant twist angle spectrum (FIG. 1(*d*), red curve, spot 2), proving that hydrogenation has only occurred in the top graphene layers, leaving the bottom two layers mostly un-functionalized.

After the 4-layer channel is converted to top hydrogenated and bottom pristine graphene layers, two $Ni_{80}Fe_{20}$ (Py) contacts (1 μm and 3 μm wide, separated by 1 μm, composed of 25 nm NiFe and capped with 5 nm Au) for spin injection/detection are deposited by electron beam evaporation in electron beam lithography defined trenches with subsequent acetone lift-off. These contacts (or "pins") are written using an electron-beam lithography defined PMMA mask to form the NLSV structure illustrated in FIG. 1(b). The pins are numbered in FIG. 1(a) for later reference. Most electrical measurements are performed in a variable temperature, cryogen-free cryostat/electromagnet system.

Example 2

Demonstration of Tunneling Behavior

Figure 2:
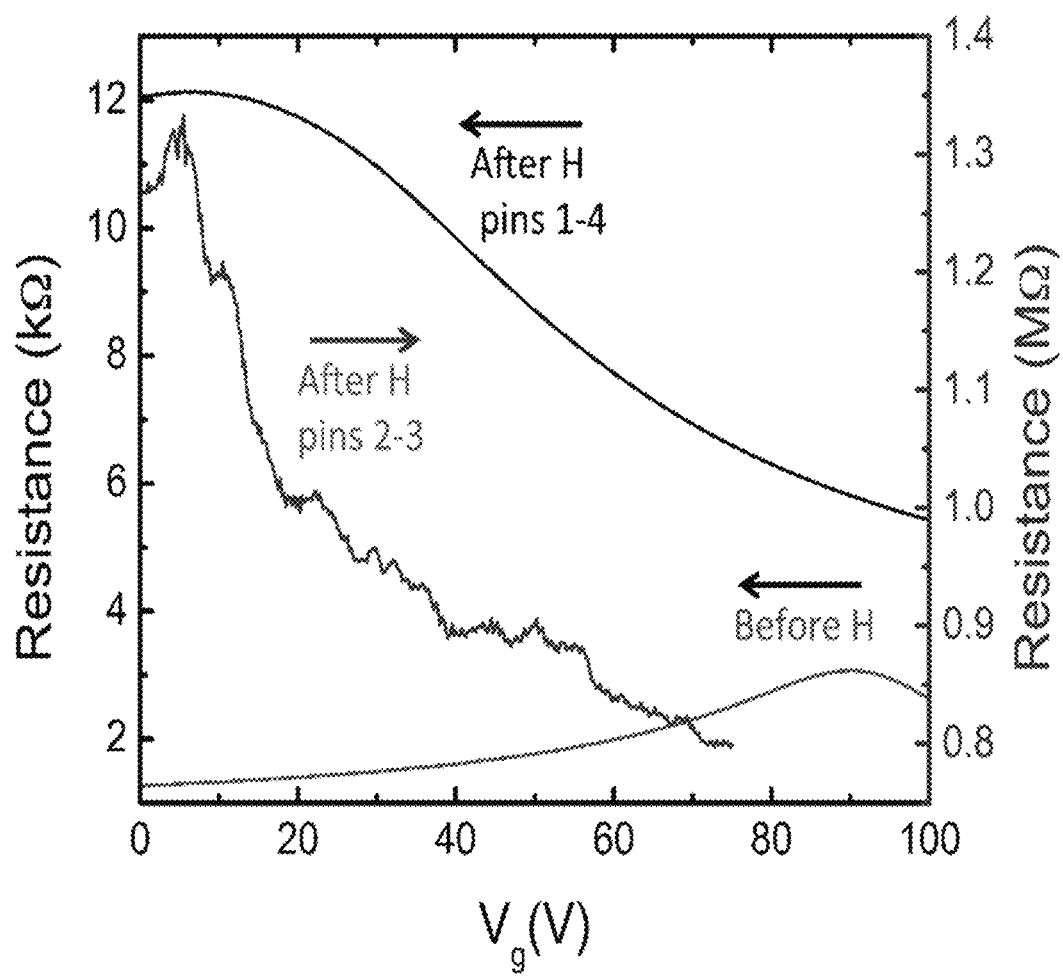
FIG. 2 illustrates: (a) Resistance vs. Gate voltage for the device before hydrogenation, after hydrogenation for contacts 1 and 4, nominally only on the conductive channel, and after hydrogenation for contacts 2 and 3, nominally only on the resistive tunnel barrier portion of the device. The Dirac point shifts from ~90 V before hydrogenation to ~10 V after hydrogenation, expected due to n-doping by hydrogen. The differences in resistance between the curves taken between contacts 1-4 and 2-3 indicate electrical separation of the graphene layers necessary for tunneling.

To test for tunneling behavior in the device, we perform charge transport measurements. The first curve in FIG. 2 shows the resistance measured between the Ti/Au contacts (1 and 4 in FIG. 1(a)) vs. back gate voltage and a Dirac point at ~90 V before hydrogenation, indicating a very conductive structure with strong p-type doping. This doping is most likely due to impurities adsorbed on the graphene surface. After hydrogenation of the top layers, the same measurement (FIG. 2) shows a Dirac point at ~10 V, which we attribute to conduction in the bottom graphene layers. In contrast with fluorination, which creates very strongly p-type graphene devices when combined in a fluorographene/graphene stack, hydrogenation is known to create n-type devices. Such n-type doping would be expected to shift the Dirac point to lower values.

The resistance of the channel between the Ti/Au contacts increases after hydrogenation (~3.5 kΩ to ~12 kΩ at the Dirac point for this device), which is to be expected as the top graphene layers are turned insulating from hydrogenation. A concurrently hydrogenated single-layer of graphene has a resistance of ~45 GΩ, indicating that the hydrogenation creates an insulator in the top layers of our device and conduction occurs in the lower un-hydrogenated layer(s) by first tunneling through the hydrogenated graphene.

The transistor characteristics measured between the two Py contacts (pins 2 and 3 in FIG. 1(a)), i.e. only contacting the top hydrogenated graphene film (FIG. 2), shows two orders-of-magnitude higher resistance than the measurements between the Ti/Au contacts. This increased resistance, together with the fact that single graphene layer treated at the same time has greater than Giga-Ohm resistance, supports electrical transport between the Py contacts points to tunneling.

Figure 3:
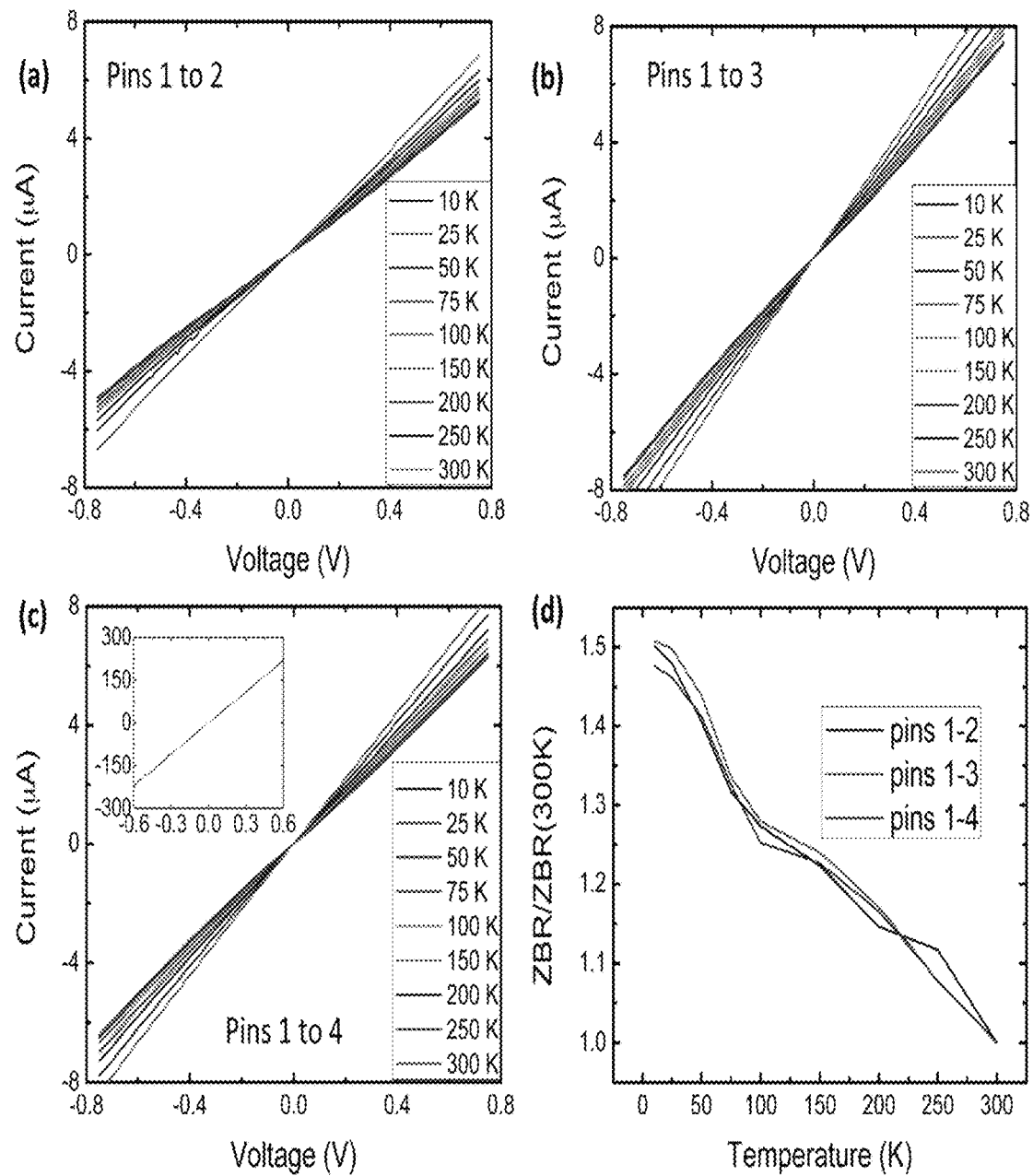
FIG. 3 illustrates: IV curves displaying non-Ohmic behavior for increasing temperature for (a) pins 1 to 2 (b) pins 1 to 3 (c) pins 1 to 4. Inset shows that the IV curve before hydrogenation is Ohmic. The resistance again increases after hydrogenation, indicating that the hydrogen diffuses under the contact, making all contacts tunneling (d) The zero-bias resistance as a function of temperature for all contacts. Weak temperature dependence indicates tunneling transport.

FIGS. 3(a) and (b) show IV curves taken between the Py (pins 2 and 3) and a reference Ti/Au contact (pin 1). These curves exhibit markedly non-Ohmic behavior, which provides support that the hydrogenated graphene is acting as a tunnel barrier. For IV curves taken between the two Ti/Au reference contacts (pins 1 to 4, FIG. 3(c)), we unexpectedly see non-Ohmic behavior and high resistance. This, plus our observation of a varying amount of resistance increase between the Ti/Au from device to device, strongly suggests that some hydrogenation occurred under the Ti/Au contacts, most likely through intercalation. Of all devices tested, most showed this behavior, with the reference contacts increasing in resistance by at least an order-of-magnitude and losing their Ohmic IV behavior after hydrogenation. The inset of FIG. 3(c) shows an IV curve taken between these pins before hydrogenation, which shows the expected Ohmic behavior. The temperature dependence of the zero bias resistance for both Py and Ti/Au contacts (FIG. 3(d)) is weak and insulator-like in character, changing by a factor ~1.5 between 5 K and 300 K for all contacts in the device. Non-Ohmic IV curves and a weakly temperature dependent zero bias resistance is a firm confirmation of a pinhole-free tunnel barrier.

Example 3

Operation of the Device as a Spin Valve

The four-terminal (4T) NLSV geometry was used to generate pure spin currents. In NLSV measurements, a bias current is applied between one of the ferromagnetic (FM, here Py) contacts and the nearest reference contact, and a spin-polarized charge current is injected from the FM across the hydrogenated graphene tunnel barrier and into the graphene transport channel. FIG. 4(a) depicts this in an energy diagram. This spin-charge current follows the electric field and flows as shown in FIG. 1(b). Spin simultaneously diffuses in all directions, creating a pure spin current, and the corresponding spin accumulation results in a spin-splitting of the chemical potential. This is manifested as a voltage on the second FM contact, which is outside of the charge current path and referred to as the non-local detector. An in-plane magnetic field is used to control the relative orientation of the magnetizations of the FM injector and detector contacts. When the magnetizations are parallel, the voltage measured will be smaller than when they are antiparallel. Sweeping the magnetic field causes the contact magnetizations to reverse in plane at their respective coercive fields and produce a measurable voltage peak. In order to observe this effect, we fabricate the FM contacts with two different widths (1 μm and 3 μm) to exploit magnetic shape anisotropy so that the coercivities of the ferromagnetic contacts are different.

This NLSV behavior is clearly observed in FIG. 4(b) at 10 K, where distinct steps in the non-local resistance (the measured detector voltage divided by the bias current) appear at the coercive fields of the wide and narrow FM contacts, producing plateaus of higher resistance when the FM contact magnetizations are antiparallel. This behavior persists to room temperature, with only a 50% decrease in magnitude observed from 10 K to 293 K, as shown in FIG. 4(c). The coercive fields decrease slightly with increasing temperature, so that the two individual peaks are not as well separated for our choice of contact geometric parameters. These data demonstrate successful spin injection and detection at the FM/hydrogenated graphene tunnel contacts, and lateral spin transport in the graphene channel.

Figure 5:
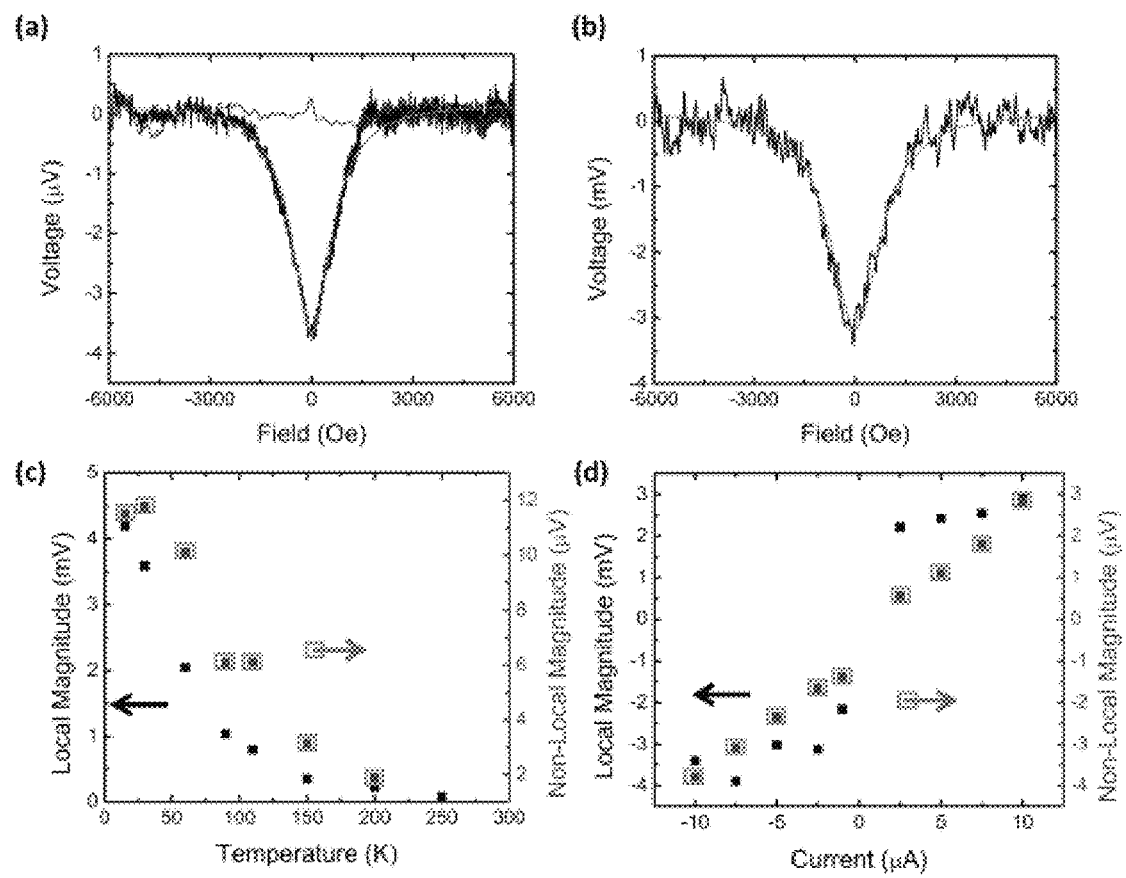
FIG. 5 illustrates: (a) 4T Non-local Hanle effect taken at 10 K and with a −10 μA bias. The line shows the data. The other line is the theoretical fit, from which a spin lifetime of ~70 ps and spin diffusion length of ~2 μm is extracted. The third line is a witness sample showing no Hanle signal, indicating that the hydrogenated graphene is necessary to achieve spin transport. (b) Two-terminal Hanle Effect taken at 10 K and with a −10 μA bias. The first line is the theoretical fit to a pseudo-Lorentzian line-shape from which a spin lifetime of ~65 ps is extracted. (c) Temperature dependence of the magnitude of the local and non-local Hanle effects. Spin signal persists to ~250 K. (d) Bias dependence of the local and non-local Hanle effects, showing the expected near linear (2T) and linear (4T) relationship and sign reversal.

The spin lifetime corresponding to this pure spin current is quantitatively determined using the Hanle effect, in which a magnetic field $B_z$ applied along the surface normal causes the spins in the graphene transport channel to precess at the Larmor frequency, $\omega_L = g\mu_B B_z/\hbar$, and dephase. Here g is the Lande g-factor (g~2 for graphene), $\mu_B$ is the Bohr magneton, and $\hbar$ is Planck's constant. As the magnetic field increases, the net spin polarization and corresponding spin voltage decreases to zero with a characteristic pseudo-Lorentzian line shape. FIG. 5(a) shows a Hanle spin precession curve for the 4-terminal non-local contact geometry. The line in FIG. 5(a) shows a scan taken from a concurrently fabricated witness device in which the graphene was not hydrogenated. We note that no NLSV signal or Hanle effect is apparent in such witness samples, demonstrating that the hydrogenated graphene tunnel barrier is necessary to achieve spin injection.

The measured Hanle signal is directly proportional to the steady-state spin polarization at the detector, given by $$S(x_1, x_2, B_z) = S_0 \int_0^\infty \frac{1}{\sqrt{4\pi Dt}} e^{-(x_2-x_1-v_d t)^2/4Dt} \cos(\omega_L t) e^{-t/t_s} dt \quad (1)$$

where spin is injected into the graphene at $x_1$ and $t=0$ and detected at $x_2$. $S_0$ is the spin injection rate, D is the electron diffusion constant, $v_d$ is the electron drift velocity (=0 for diffusive transport), and $t_s$ is the spin lifetime. Fits to the data (FIG. 5(a)) provide a measure of the spin lifetime. For the device pictured here, at a bias current of −10 μA and temperature of 10 K, 4T spin lifetimes were ~70 ps. The spin diffusion length is given by $L_{SD}=(Dt_s)^{1/2}$ where D is the diffusion constant. We find an average $L_{SD}$~2 μm, based on $t_s$~70 ps and D~0.069 m²/s at 10 K, consistent with other studies of CVD grown graphene films.

Additionally, the spin current can be injected and the spin voltage detected with same Py contact in a local, 2-terminal (2T) configuration, shown in FIG. 5(b). Here, we measure the spin accumulation and lifetime directly under the Py contact (locally). The voltage $\Delta V_{2T}(B_z)$ decreases with $B_z$ with a pseudo-Lorentzian line shape given by $\Delta V_{2T}(B_z)=\Delta V_{2T}(0)/[1+(\omega_L t_s)^2]$. In this way, fits to the Hanle curves, shown in FIG. 5(b) in red, allow us to extract the 2T spin lifetime, found to be ~65 ps, which is consistent with the non-local data.

FIG. 5(c) shows the temperature dependence of the Hanle effect with the blue squares representing the 4T non-local Hanle effect data (right axis) and the squares representing the 2T Hanle effect data (using the left axis, as indicated by the arrow). The Hanle signal persists up to ~250 K, higher than for fluorographene tunnel barriers (~200 K). We found that the spin lifetime remains mostly unchanged as a function of temperature.

FIG. 5(d) shows the bias dependence of the magnitude of the 4T non-local (squares, right axis) and 2T local (squares, left axis) Hanle voltage taken at B=0. The 2T data is slightly non-linear and the 4T is approximately linear with bias current, as expected and consistent with other studies. We also observe that the sign of the Hanle signal inverts as the sign of the bias current changes, a firm confirmation that our observed signal is due to Hanle spin precession. The observation of both the non-local Hanle effect and the NLSV provides strong evidence that the hydrogenated graphene tunnel barrier indeed enables efficient spin injection, transport, and detection in the graphene channel.

Figure 4:
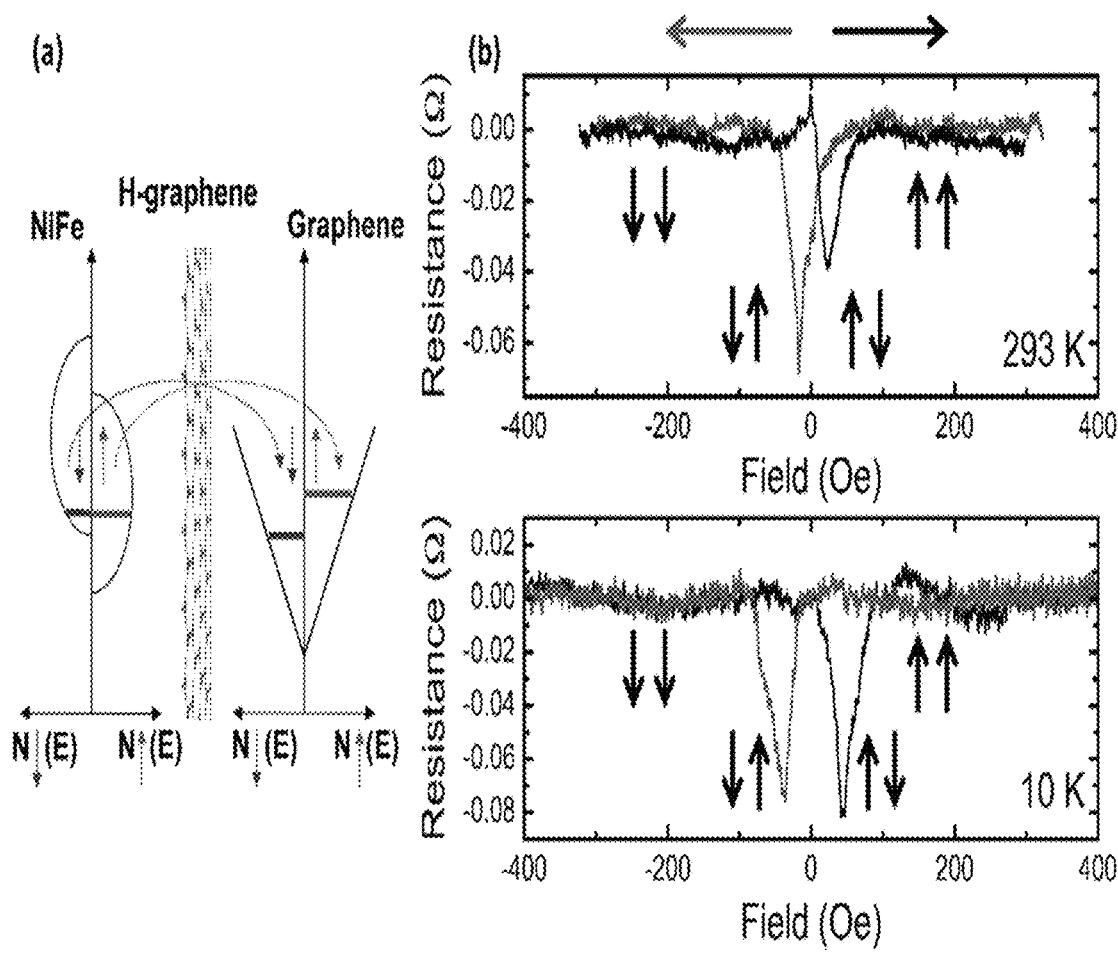
FIG. 4 illustrates: (a) Energy diagrams for polarized spin tunneling. Spins from the NiFe tunnel across the hydrogenated graphene and into available states in the graphene. (b) NLSV at 10 K (lower graph) and 293 K (upper graph). The curve is for sweeping the field from negative to positive, and the other curve is for sweeping the field from positive to negative, as indicated by the directions of the colored arrows above the plot. The arrows inside the plots indicate the relative magnetic orientations of the contacts. A ~150Ω background signal has been subtracted from the data.
Figure 6:
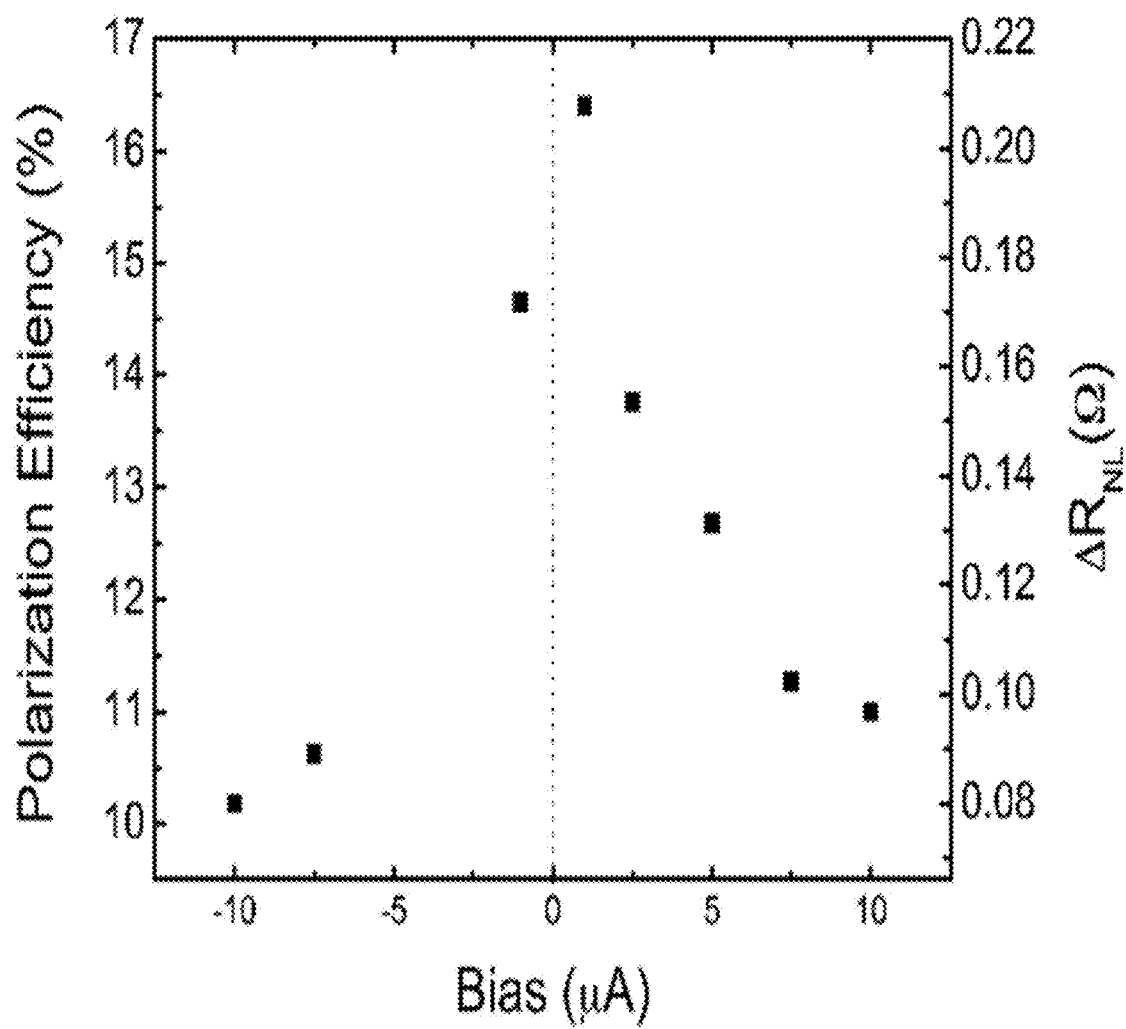
FIG. 6 illustrates measured magnitude of the NLSV peak and calculated polarization efficiency as a function of sample bias taken at 10 K.

Based on the magnitude of the NLSV signal and the calculated spin diffusion length from the Hanle measurements, we can determine the spin polarization efficiency, P, using the formula:

$$R_{non-local} = \frac{P^2 L_{SD}}{W\sigma} \exp(-L/L_{SD}) \quad (2)$$

Where the σ is the measured conductivity of $2.83 \times 10^{-3} \Omega^{-1}$ for the device shown in FIG. 4, L is the center to center contact spacing of 3 μm, $L_{SD}$ is the spin diffusion length of 2 μm, W is the width of the graphene channel of 15 μm, and $R_{non-local}$ is the magnitude of the NLSV plateau of ~0.08Ω. From this, we find P~10%. FIG. 6 summarizes the magnitude of the NLSV peak and the calculated polarization efficiency as a function of bias. The non-linear increase of the polarization efficiency and the NLSV resistance with a decrease in bias is typical of NLSV devices.

For most other types of graphene spintronic devices, the tunnel barrier and transport channel are very different materials, and such devices require mating dissimilar materials, raising issues of heteroepitaxy, layer uniformity, interface stability and electronic defect states that severely complicate fabrication and compromise performance. Our approach obviates these issues. Our approach does not rely upon a second material "wetting" the graphene surface to obtain a uniform and complete tunnel barrier. Graphene has a strong tendency to be very uniform in thickness down to a single atom, has very few defects, does not easily form vacancies, and does not intermix readily with other materials—these are key characteristics for a tunnel barrier, in which the tunnel current depends exponentially on the barrier thickness. Our approach provides a simple and effective way to form a tunnel barrier on graphene. The functionalized graphene tunnel barrier does not affect the adjacent transport channel because it is comprised of the same material, contrary to evaporated dielectric or oxidized metal tunnel barriers, which can structurally damage the graphene or add impurity dopants. This is readily indicated by our high spin polarization values and spin relaxation lengths on par with other high quality graphene devices. Our complete tunnel barrier/transport channel structure also provides for the second thinnest of this type of structure ever made (4 atoms thick), allowing it to be used in applications where space is a premium.

Furthermore, due to the thinness of the tunnel barrier, and the advantage that it allows for true electron tunneling, our structure has lower impedance and less loss than other previously made designs, allowing its use in ultra low-power electronics architectures. Moreover, the use of hydrogenation using the Birch reduction process allows for essential room temperature operation and stable functionalization, which was not achieved in previous homoepitaxial tunnel barrier/transport structures. The Birch reduction process also provides a non-damaging method of hydrogenation, as opposed to plasma treatments that also hydrogenate but damage the graphene lattice. Finally, the presence of magnetic moments in the hydrogenated graphene can provide a method of spin relaxation, thus control over the spin valve. This control is not evident in fluorinated graphene tunnel barrier devices or oxide tunnel barrier devices.

A majority of previous tunnel barrier devices using graphene as the conductive transport channel rely on deposited oxides or post deposition oxidized metals, usually both consisting of $Al_2O_3$ or MgO. The deposition is performed with three types of methods: 1) evaporative methods with either thermal or electron beam evaporation to deposit an oxide. Here, the evaporated oxide or metal tends to ball up on the surface, causing cracks and pinholes that limit tunneling. 2) Sputter evaporation of oxide or metal. Here, it has been shown that the graphene transport channel can be irreversibly damaged. 3) Atomic layer deposition of oxides. Here, successful deposition usually requires a chemical pretreatment of the graphene film, which adds dopants that affect the transport properties. Moreover, oxide tunnel barriers are known to be very difficult to form on graphene since they exhibit de-wetting in the absence of prior chemical treatment of the graphene, and attempts to mitigate this to create a good surface for oxide growth may induce scatterers and defects.

Only three other methods have been devised for making tunnel barriers on graphene. First, a method of high-energy electron beam lithographic decomposition of vaporized carbon can produce amorphous carbon layers on the surface of the graphene channel and can act as a tunnel barrier. Although this method produces tunnel barriers, the high-energy electron beam adds charged impurities to the substrate, affecting the transport properties of the graphene channel, and it can induce physical damage to the graphene by driving off individual carbon atoms from the lattice. A second alternative method involves the chemical vapor deposition growth of thin layer hexagonal-BN, which is then transferred in a similar way to the graphene transfer. However, this process does not produce exceptional results and is not homoepitaxial, requiring the growth and transfer of two completely different materials with vastly different growth mechanisms and properties. Thus, it is also unsuitable for industrial scaling. Finally, it was shown that fluorination of the upper graphene layer can also form a tunnel barrier for a homoepitaxial graphene tunnel barrier/transport channel device. Those devices showed a higher spin lifetime and polarization efficiency. The maximum low-bias spin polarization measured here of ~16.5% is significantly lower than the 45% measured in fluorographene tunnel barriers, although still high for graphene devices, where less than 10% is the norm for oxide based tunnel barriers. However, fluorine is not as stable as hydrogen on the surface of the graphene. Moreover, those devices did not show room temperature spin valve operation, which is essential for any future applications. Additionally, persistent ferromagnetic moments that can be used for control of the spin relaxation in the hydrogenated tunnel barrier devices are absent in the fluorinated devices where only paramagnetism is expected and limited low temperature operation.

Many modifications and variations of the present invention are possible in light of the above teachings. It is therefore to be understood that the claimed invention may be practiced otherwise than as specifically described. Any reference to claim elements in the singular, e.g., using the articles "a," "an," "the," or "said" is not construed as limiting the element to the singular.

What we claim is:

1. A homoepitaxial tunnel barrier transport device with hydrogenated graphene-on-graphene, comprising:
a substrate;
a monolayer graphene film;
wherein the monolayer graphene film has encapsulated edges formed by utilizing deep-UV lithography and a MMA/PMMA mask and sputter-depositing SiN wherein the SiN is about 10 nm; and
a chemically modified monolayer graphene film
wherein the chemically modified monolayer graphene film is a hydrogenated monolayer graphene film.

2. The homoepitaxial tunnel barrier transport device with functionalized graphene-on-graphene of claim 1, wherein there is no electrical connection between the monolayer graphene film and the chemically modified monolayer graphene film.

3. A homoepitaxial tunnel barrier with hydrogenated graphene-on-graphene formed by the steps comprising growing graphene by chemical vapor deposition via decomposition of methane in a copper foil enclosure, removing the copper foil by etching, transferring and stacking graphene layers on a substrate, defining graphene mesas utilizing deep-UV lithography and an etch mask with PMMA and oxygen plasma, rinsing in acetone and isopropyl alcohol and removing the etch mask, defining reference contacts and bond pads, depositing Ti/Au using electron beam deposition, encapsulating edges of the graphene layers utilizing deep-UV lithography and a MMA/PMMA mask, sputter-depositing SiN wherein the SiN is about 10 nm, hydrogenating the graphene, and forming the homoepitaxial tunnel barrier.

4. The homoepitaxial tunnel barrier with hydrogenated graphene-on-graphene of claim 3 wherein the step of transferring and stacking graphene layers on a substrate includes stacking 4 graphene layers and wherein after the step of hydrogenating a conductive channel is present in the layers.

5. A homoepitaxial tunnel barrier with hydrogenated graphene-on-graphene formed by the process comprising providing a multilayer stack of graphene having top layers and bottom layers, encapsulating edges of the graphene layers utilizing deep-UV lithography and a MMA/PMMA mask, sputter-depositing SiN wherein the SiN is about 10 nm, hydrogenating the top layers of graphene, and creating a homoepitaxial tunnel barrier.

* * * * *